(12) United States Patent
Ng et al.

(10) Patent No.: US 10,636,800 B2
(45) Date of Patent: Apr. 28, 2020

(54) DISCHARGEABLE ELECTRICAL PROGRAMMABLE READ ONLY MEMORY (EPROM) CELL

(71) Applicant: HEWLETT-PACKARD DEVELOPMENT COMPANY, L.P., Houston, TX (US)

(72) Inventors: Boon Bing Ng, Singapore (SG); Lui Cheat Thin, Singapore (SG); Reynaldo V Villavelez, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 108 days.

(21) Appl. No.: 15/543,355

(22) PCT Filed: Jan. 29, 2015

(86) PCT No.: PCT/US2015/013414
§ 371 (c)(1),
(2) Date: Jul. 13, 2017

(87) PCT Pub. No.: WO2016/122507
PCT Pub. Date: Aug. 4, 2016

(65) Prior Publication Data
US 2018/0006045 A1    Jan. 4, 2018

(51) Int. Cl.
*H01L 29/788*  (2006.01)
*H01L 27/11517* (2017.01)
(Continued)

(52) U.S. Cl.
CPC .. *H01L 27/11517* (2013.01); *H01L 27/11521* (2013.01); *H01L 29/40114* (2019.08);
(Continued)

(58) Field of Classification Search
CPC ......... H01L 27/11517; H01L 29/42356; H01L 27/11521; H01L 21/28273; H01L 29/42324; H01L 29/7881; H01L 29/66825
See application file for complete search history.

(56) References Cited

U.S. PATENT DOCUMENTS 5,764,096 A   6/1998 Lipp et al.
7,345,915 B2  3/2008 Benjamin
(Continued)

FOREIGN PATENT DOCUMENTS

JP   05-335656   12/1993
JP   11-214548    8/1999

OTHER PUBLICATIONS

Lee, Jae-Duk et al., Effects of Floating-Gate Interference on NAND Flash Memory Cell Operation, IEEE Electron Device Letters, May 2002, 3 pages, vol. 23, No. 5.

*Primary Examiner* — Cuong B Nguyen
*Assistant Examiner* — Samuel Park
(74) *Attorney, Agent, or Firm* — Crawford Maunu PLLC

(57) ABSTRACT

The present subject matter relates to an electrical programmable read only memory (EPROM) cell. The EPROM cell comprises a semiconductor substrate and a floating gate separated from the semiconductor substrate by a first dielectric layer. A control gate is capacitively coupled to the floating gate through a second dielectric layer disposed between the floating gate and the control gate. In an example, the EPROM cell further comprises a conductive gate connected to the floating gate, wherein the conductive gate is to leak charges from the floating gate in a predetermined leak time period.

20 Claims, 4 Drawing Sheets

(51) Int. Cl.
*H01L 27/11521* (2017.01)
*H01L 29/66* (2006.01)
*H01L 29/423* (2006.01)
*H01L 21/28* (2006.01)

(52) U.S. Cl.
CPC .. *H01L 29/42324* (2013.01); *H01L 29/42356* (2013.01); *H01L 29/66825* (2013.01); *H01L 29/7881* (2013.01)

(56) References Cited

U.S. PATENT DOCUMENTS

| | | |
|---|---|---|
| 7,655,569 B2 | 2/2010 | Inaba et al. |
| 7,715,242 B2 | 5/2010 | Hung |
| 8,823,072 B2 | 9/2014 | Kim et al. |
| 8,864,260 B1 | 10/2014 | Ge et al. |
| 2003/0206437 A1* | 11/2003 | Diorio ................... H01L 27/115 365/185.03 |
| 2004/0070495 A1* | 4/2004 | Chu ....................... G01D 3/022 340/501 |
| 2006/0281247 A1 | 12/2006 | De Zaldivar |
| 2008/0112225 A1 | 5/2008 | Benjamin |

* cited by examiner

DISCHARGEABLE ELECTRICAL PROGRAMMABLE READ ONLY MEMORY (EPROM) CELL

BACKGROUND

Many electronic devices, such as consumer electronics, automobiles, computing systems, and other devices associated with the computing systems, include integrated circuits to perform a variety of tasks. Accordingly, various integrated circuits may have varying configurations depending on end tasks to be performed. For example, integrated circuits may form memory chips to store data.

Integrated circuits, such as read-only memory (ROM) chips, programmable read-only memory (PROM) chips, electrical programmable read-only memory (EPROM), and the like may be used to store data. Such chips generally comprise a plurality of memory cells arranged in an array. The memory cells may be in a high resistance state or a low resistance state to store one bit of data corresponding to logic '1' or logic '0', respectively.

BRIEF DESCRIPTION OF FIGURES

The detailed description is provided with reference to the accompanying figures. In the figures, the left-most digit(s) of a reference number identifies the figure in which the reference number first appears. The same numbers are used throughout the figures to reference like features and components.

DETAILED DESCRIPTION

Figure 1:
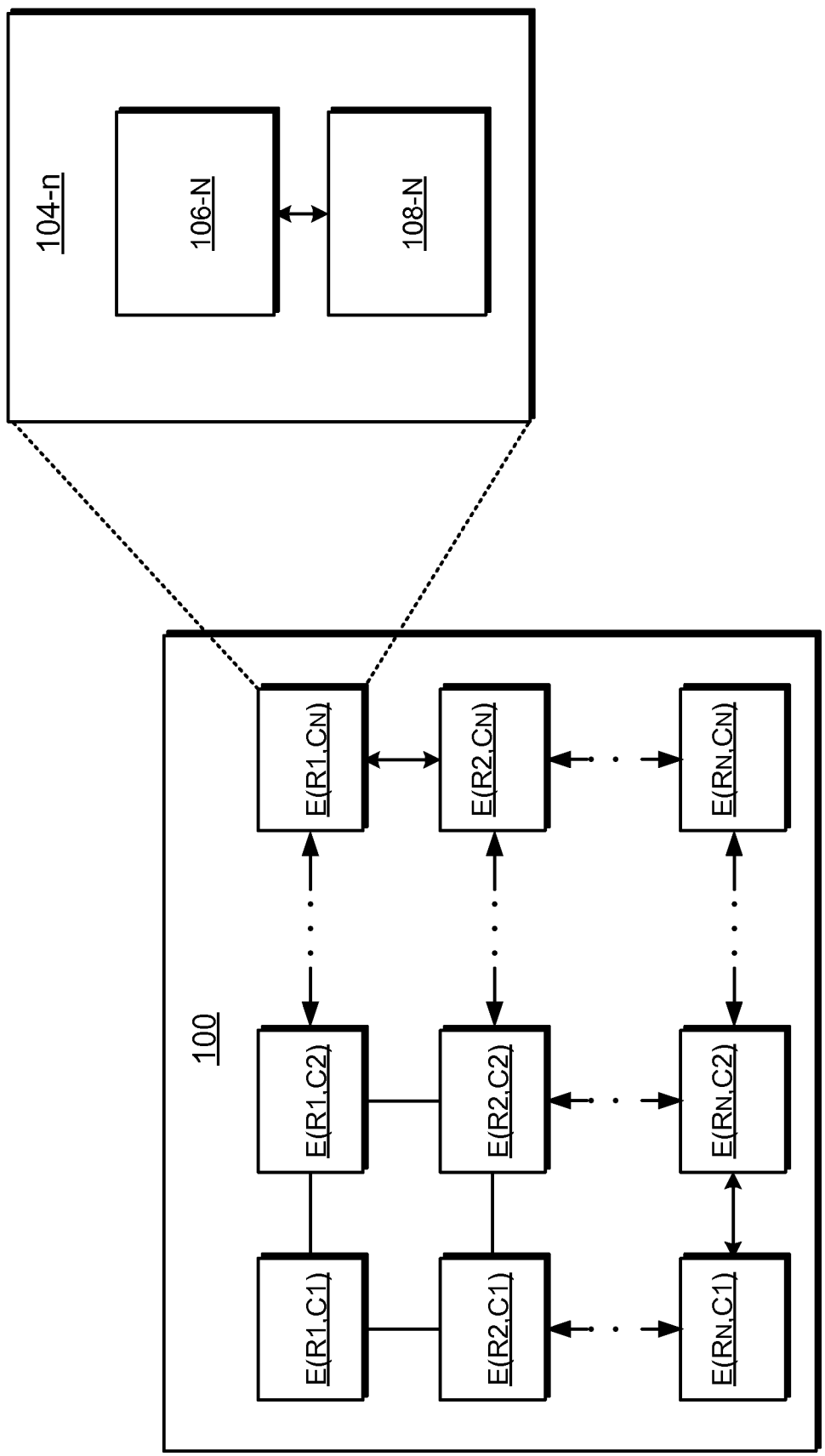
FIG. 1 illustrates an integrated circuit, in accordance with one example implementation of the present subject matter.

The present subject matter relates to an integrated circuit, such as a memory chip. In an example, the memory chip may be an electrical programmable read only memory (EPROM) chip having an EPROM array. An EPROM array generally comprises a conductive grid of columns and rows with an EPROM cell disposed at each intersection of the rows and columns. Each EPROM cell has two gates that are separated from each other by a dielectric layer. One of the gates is called a floating gate and the other is called a control gate. The floating gate links to a corresponding row through the control gate.

The floating gate, initially, has no charge, which causes the EPROM cell to be in a low resistance state, giving a value of logic '0' to a bit stored in the EPROM cell. To change the value of the bit to logic '1', i.e., a high resistance state, a programming voltage is applied to the control gate of the EPROM cell. The programming voltage is such that an adequate quantity of electrons is pushed into the floating gate, thereby increasing a threshold voltage of the EPROM cell. Once programmed, the electrons remain stored in the floating gate and the EPROM cell holds the charge until it is further reprogrammed.

In accordance with one example implementation of the present subject matter, a dischargeable EPROM cell that may dissipate the stored charge in a predetermined time is described. Further, in accordance with one example implementation of the present subject matter, an integrated circuit comprising an EPROM array, having one or more dischargeable EPROM cells disposed at predetermined positions in the EPROM array, is also described.

In an example, each of the dischargeable EPROM cells comprises a floating gate, wherein the floating gate is to store electrons upon the EPROM cell being programmed. The floating gate is electrically connected to a conductive gate. The conductive gate dissipates the electrons from the floating gate in a predetermined leak time period. In accordance with one example implementation of the present subject matter, the conductive gate may have an exposed surface to leak the electrons that get accumulated in the floating gate when the EPROM cell is programmed.

Accordingly, an EPROM cell which may otherwise store the charge for a substantially longer duration, may lose the charge in the predetermined leak time period. In an example, the integrated circuits comprising the EPROM array, may have one or more dischargeable EPROM cells, that change state in the predetermined leak time period, included at predetermined positions in the EPROM array. The described integrated circuits may be used for a variety of applications, for instance, to check quality of circuits on consumables, such as print cartridges, which may include ink cartridges and titration print heads. Further, in one example, traditional systems and methods may be used for testing and programming the presently described integrated circuits that incorporate one or more dischargeable EPROM cell, thereby making it convenient to use the present integrated circuits in various devices without incurring extra costs.

The above discussed integrated circuits and dischargeable EPROM cells are further described in the figures and associated description below. It should be noted that the description and figures merely illustrate the principles of the present subject matter. It will thus be appreciated that various arrangements that embody the principles of the present subject matter, although not explicitly described or shown herein, can be devised from the description and are included within its scope.

FIG. 1 illustrates an integrated circuit 100, in accordance with one example implementation of the present subject matter. In an example, the integrated circuit 100 may be a non-volatile memory chip, such as an Electrically Programmable Read Only Memory (EPROM) chip. The EPROM chip may include an EPROM array 102 amongst other things. The EPROM array 102 comprises a plurality of EPROM cells E(R1,C1), E(R1,C2), . . . , E(Rn,Cn). As illustrated, EPROM cells E(R1,C1), E(R1,C2), . . . , E(Rn, Cn) of the EPROM array 102 are disposed in rows and columns in a grid-like manner.

In an example implementation, the EPROM array 102 may comprise one or more dischargeable EPROM cells 104-1, 104-2, 104-3, . . . , and 104-n located at predetermined positions in the EPROM array 102. In other words, one or more EPROM cells E(R1,C1), E(R1,C2), . . . , E(Rn, Cn) in the EPROM array 102 may be dischargeable. Such EPROM cells E(R1,C1), E(R1,C2), . . . , E(Rn,Cn), are herein referred to as dischargeable EPROM cells 104-1, 104-2, 104-3 . . . , and 104-n. In the illustrated example implementation, the last EPROM cell E(R1, Cn) of the first row of the EPROM array 102 is dischargeable.

The dischargeable EPROM cell E(R1, Cn), hereinafter referred to as EPROM cell 104-*n*, comprises a floating gate 106-*n*, which is connected to a conductive gate 108-*n* of the EPROM cell 104-*n*.

In operation, upon programming of the EPROM cell 104-*n*, the floating gate stores electrons, while the conductive gate 108-*n* dissipates the electrons stored in the floating gate 106-*n*. Accordingly, once the EPROM cell 104-*n* is programmed, for example, by applying a programming voltage, after a lapse of a predetermined leak time period, the EPROM cell 104-*n* looses its charge due to dissipation of the electrons stored in the floating gate 106-*n* through the conductive gate 108-*n*. In an example, the predetermined leak time period may be based on a surface area of an exposed surface of the conductive gate 108-*n*.

Accordingly, the EPROM cell 104-*n*, which ordinarily would have retained the electrons in the floating gate for a substantially long time after being programmed, dissipates the same in the predetermined leak time period through the conductive gate 108-*n*. Thus, in an example implementation, where the entire EPROM array 102 may be programmed, while the other EPROM cells of the EPROM array 102 retain the charge, the dischargeable EPROM cells 104-1, 104-2, 104-3, and 104-*n*, may leak the charge.

Leaking of the charge by the dischargeable EPROM cells 104-1, 104-2, 104-3, . . . , and 104-*n* causes a change in the data programmed in the EPROM array 102. The change in the data is in accordance with the predetermined location of the dischargeable EPROM cells 104-1, 104-2, 104-3, . . . , and 104-*n*. This may be better explained with the help of the example provided below.

Consider an EPROM array comprising a single row of eight EPROM cells, for instance. Upon programming, each of the eight EPROM cells may store one bit of data having a logic '1' value and accordingly, the data stored in the EPROM array may be 255. If, in the present example, the EPROM cell at a least significant bit (LSB) position of the EPROM array is a dischargeable EPROM cell, the LSB bit will become logic '0' after the predetermined leak time period due to the leakage of the charge. Thus, the data read from the EPROM array after the predetermined leak time period will be 254 and not 255. Similarly, in case the EPROM cell at the LSB+1 position is dischargeable, the data read from the EPROM array after the predetermined leak time period is 253.

Since the location of the dischargeable EPROM cells 104-1, 104-2, 104-3, and 104-*n* is predetermined, the change in the data that is programmed in the integrated circuit 100 may be determined. Such a determination may be further used for various purposes, for example, to identify source of a given product. For example, a controller may write data onto the integrated circuit 100 and subsequently read the data after the lapse of the predetermined leak time period. If the change in the data written in the integrated circuit 100 is in accordance with the predetermined positions of the dischargeable EPROM cells 104-1, 104-2, 104-3, . . . , and 104-*n*, as provided to the controller by a source, the controller may determine the integrated circuit 100, or a product that may incorporate the integrated circuit 100, to be associated with the source.

Figure 2:
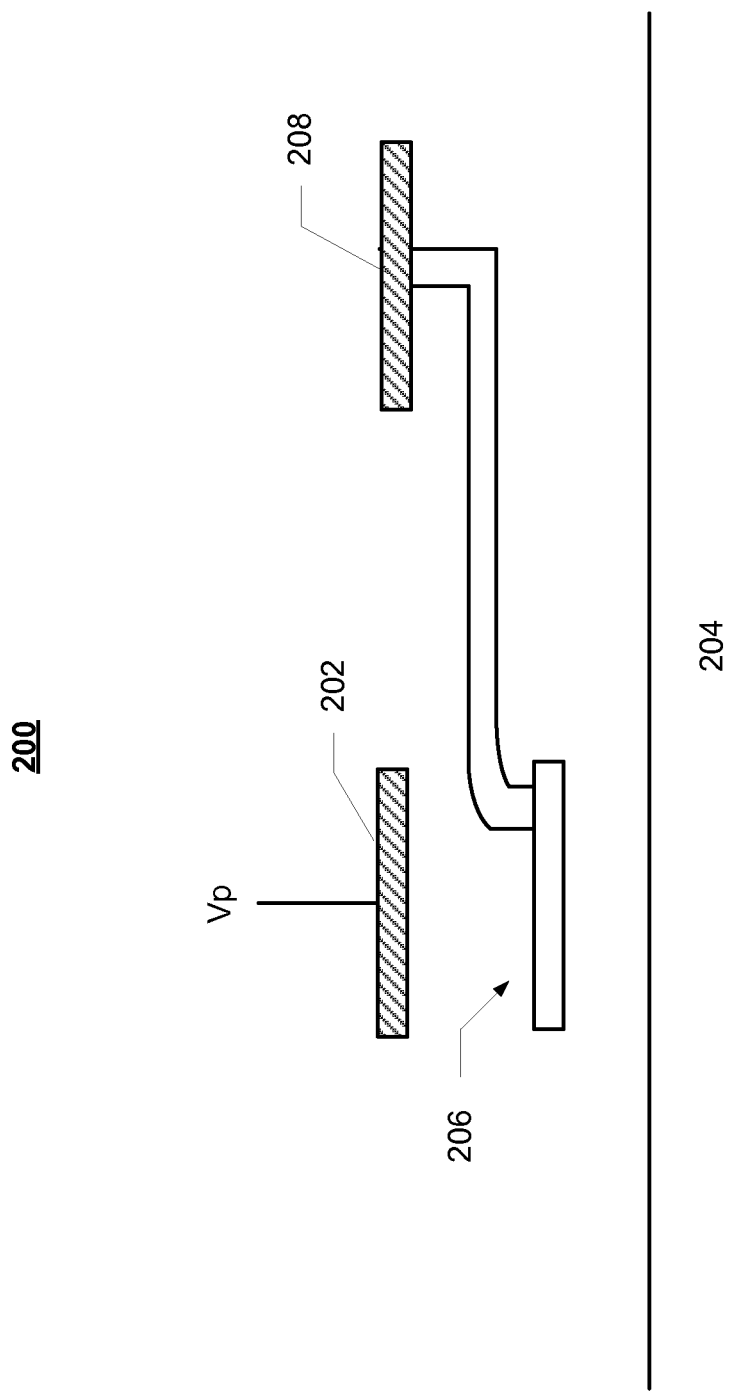
FIG. 2 illustrates a dischargeable electrical programmable read only memory (EPROM) cell according to an example of the present subject matter.

Further details of working of a dischargeable EPROM cell is provided in reference to FIG. 2 that illustrates a dischargeable EPROM cell 200 according to an example of the present subject matter.

As mentioned previously, an EPROM chip comprises a conductive grid of rows and columns (not shown in Figures). An EPROM cell, for example, the dischargeable EPROM cell 200 depicted in FIG. 2 is present at an intersection of a row and a column. The dischargeable EPROM cell 200, also referred to as the EPROM cell 200 for simplicity, comprises a column control transistor and a row control transistor (not shown in figure). To program the EPROM cell 200, the EPROM cell 200 is selected by applying a voltage to the row control transistor and to the column control transistor. A programming voltage $V_p$ is then applied at an control gate 202 of the EPROM cell 200 to program the EPROM cell 200.

In an example, a resistor (not shown in figure) may be disposed in series between the drain 202 and a source of the programming voltage $V_p$ to provide a breakdown current limit for the EPROM cell 200. The programming voltage $V_p$ causes electrons from a semiconductor substrate 204 to move into a floating gate 206 of the EPROM cell 200. Further, as discussed earlier, in an example implementation, the floating gate 206 is electrically connected to a conductive gate 208 to provide a path to leak the electrons stored in the floating gate 206 of the EPROM cell 200. The leakage of the electrons through the conductive gate 208 may, in turn, result in change in a state of a corresponding bit of the EPROM chip in a predetermined leak time period.

In accordance with an example implementation of the EPROM cell 200, the conductive gate 208 may have an exposed surface located at the top-most surface of the EPROM cell 200, for example. The predetermined leak time period may be based on a surface area of the exposed surface of the conductive gate 208. In an example, the predetermined leak time period is in the range of few microseconds to few tens of minutes.

Figure 3A:
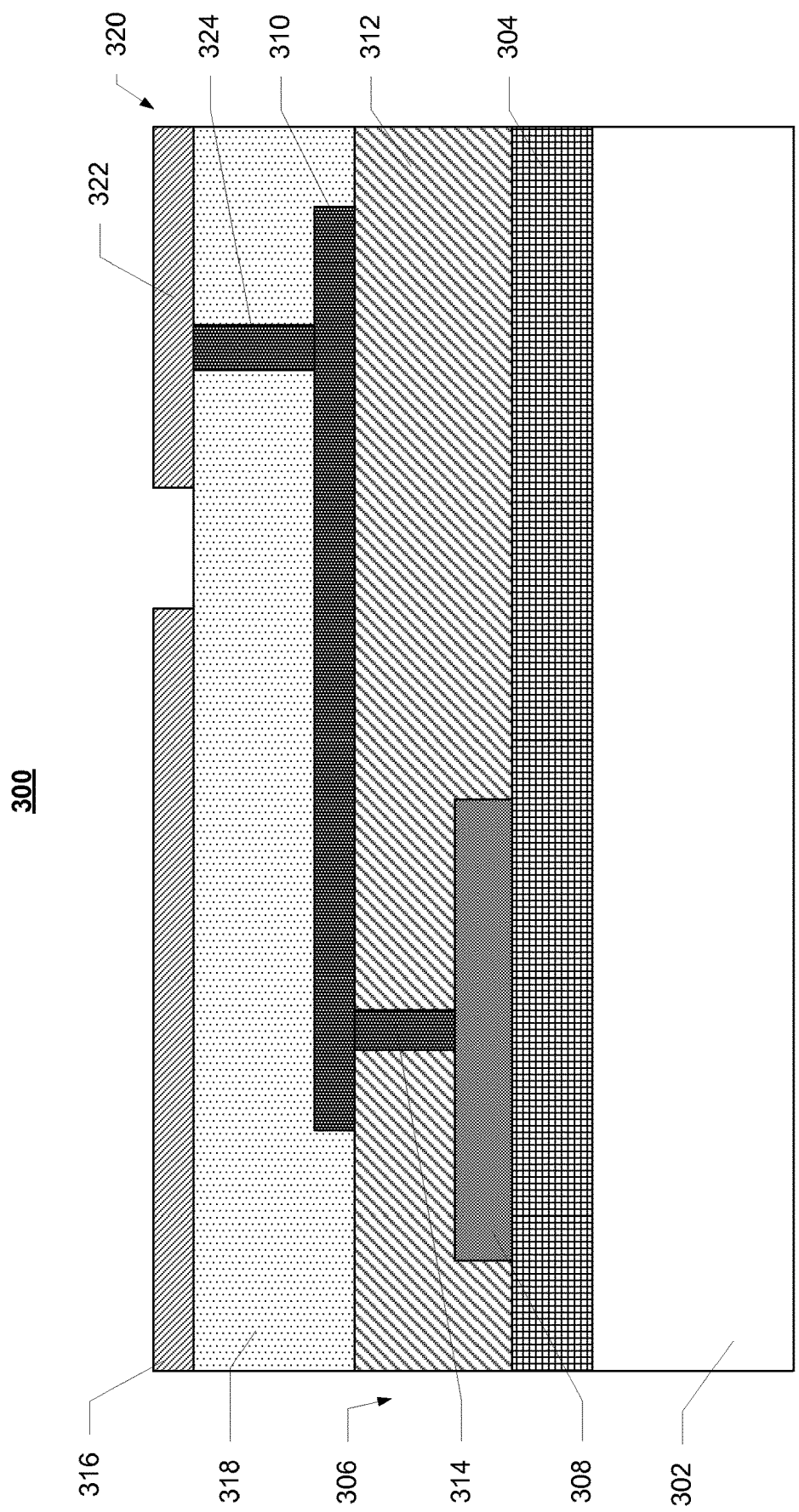
FIG. 3a illustrates a cross-sectional view depicting various layers of the dischargeable EPROM cell, in accordance with one example implementation of the present subject matter
Figure 3B:
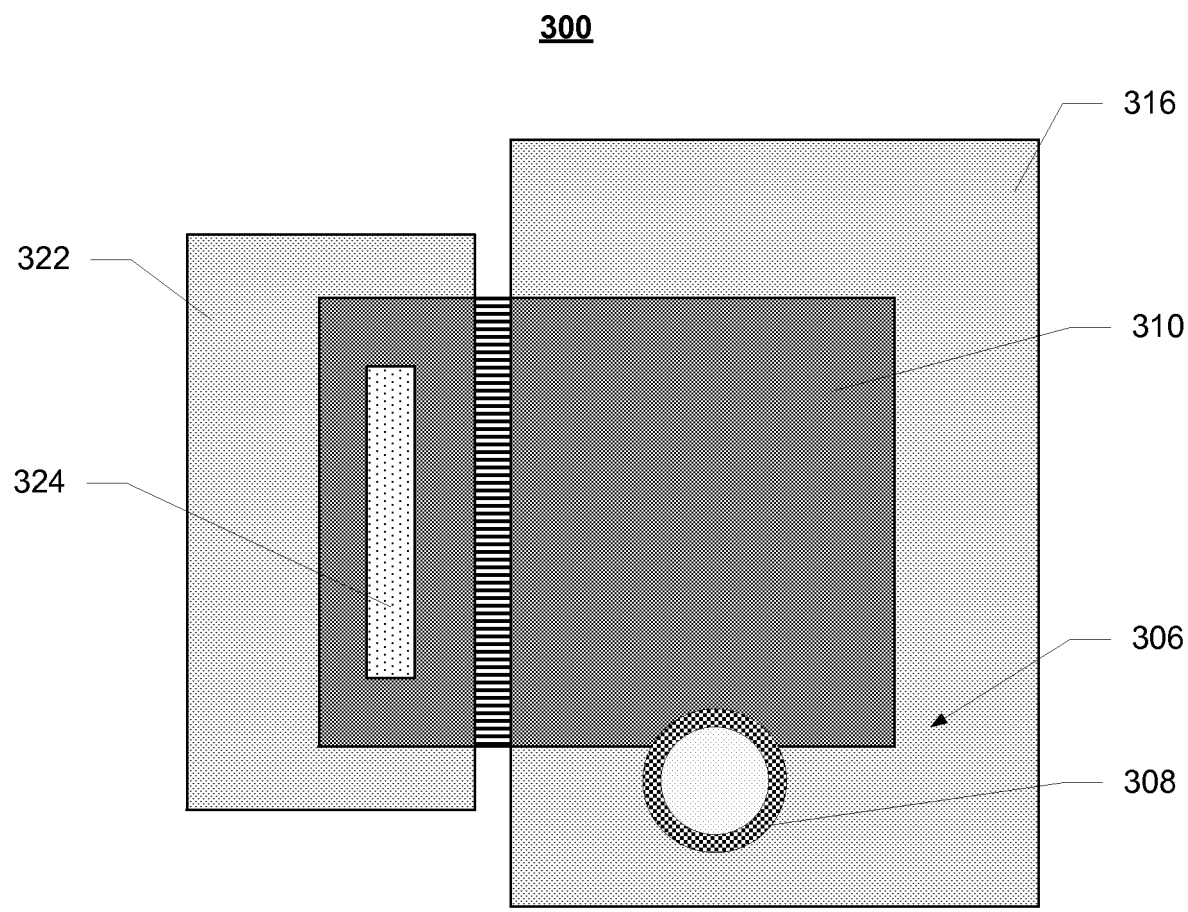
FIG. 3b illustrates a schematic view of the dischargeable EPROM cell according to another example of the present subject matter.

The operation of a dischargeable EPROM cell may be further elaborated with reference to FIGS. 3*a* and 3*b* that depict the construction of the EPROM cell 300 in accordance with an example implementation of the present subject matter. FIG. 3*a* shows a cross-sectional view depicting various layers of the dischargeable EPROM cell 300, in accordance with one example implementation of the present subject matter while FIG. 3*b* shows a schematic view of the dischargeable EPROM cell 300, in accordance with one example implementation of the present subject matter.

The following description has been explained with reference to an EPROM chip, however it will be appreciated that the principles discussed herein may be extended to other integrated circuits as well, albeit with a few variations.

As mentioned previously, in an EPROM chip having an EPROM array, one or more dischargeable EPROM cells, alike the EPROM cell 300, may be present, while, at the same time, there may be other EPROM cells in the EPROM array that are not dischargeable and may retain the charge after programming. Referring to FIG. 3*a*, the cross-sectional view of FIG. 3*a* showing the various layers corresponds to one bit of the EPROM array wherein the bit is dischargeable.

In an example, the EPROM cell 300 includes a semiconductor substrate 302. The semiconductor substrate 302 may comprise, for instance, silicon substrate. The semiconductor substrate 302 has n-doped regions or p-doped regions (not shown in figure). The n-doped regions may form a source junction and a drain junction of the EPROM cell 300 or the p-doped regions may form a source junction and a drain junction of the EPROM cell 300 depending on the configuration of the EPROM cell 300. In one example, the semiconductor substrate 302 may have a thickness of about 675 microns, and the source junction and the drain junction may have a thickness in a range of about 1-1.5 microns.

A first dielectric layer 304 is disposed atop the semiconductor substrate 302. In an example, the first dielectric layer

304 may be a gate oxide layer. The gate oxide layer may include, for example, silicon dioxide and may have thickness of about 700 angstroms (A) in one example.

The first dielectric layer 304 capacitively couples the semiconductor substrate 302 to a floating gate 306 of the EPROM cell 300. In an example implementation, the floating gate 306 comprises a semiconductive polysilicon layer 308 and a conductive metal layer 310 electrically connected to each other. In one example, the semiconductive polysilicon layer 308 may have a thickness of about 3600 A. Similarly, in an example, the conductive metal layer 310 may comprise aluminum copper silicon (AlCuSi), tantalum aluminum (TaAl)/aluminum copper (Alcu), and may have a thickness of about SKA.

Over the semiconductive polysilicon layer 308, and partially surrounding the semiconductive polysilicon layer 308 and the gate oxide layer, a gate-dielectric layer 312 may be provided. As depicted in the illustrated implementation, the conductive metal layer 310 is disposed over the gate-dielectric layer 312. For instance, the gate-dielectric layer 312 may include borophosphosilicate glass (BPSG)/undoped silicon glass (USG) or phosphosilicate glass (PSG)/reox, and may have a thickness of about 10-12 KA. In an example, a via 314 may be placed in the gate-dielectric layer 312 to connect the semiconductive polysilicon layer 308 to the conductive metal layer 310.

Accordingly, the semiconductive polysilicon layer 308, the conductive metal layer 310 and the via 314 together make the floating gate 306 of the EPROM cell 300. The floating gate 306 of the EPROM cell 300 is capacitively coupled to a control gate 316 of the EPROM cell 300 through a second dielectric layer 318 disposed between the floating gate 306 and the control gate 316.

The second dielectric layer 318 may be provided atop the conductive metal layer 310 to couple the floating gate 306 to the control gate 316. In an example, the control gate 316 is formed in a metal layer 320 of the EPROM cell 300. In one example, the control gate 316 may include TaAl/AlCu or Ta/Au, and may have a thickness of about 4-5 KA. Further, the second dielectric layer 318 may include, for instance, Tetraethyl orthosilicate (TEOS)/silicon nitride (SIN) or SIN/silicon carbide (SiC) and may have a thickness of about 3-5 KA in one example.

In accordance with in an example implementation of the present subject matter, the EPROM cell 300 further includes a conductive gate 322. As mentioned previously, the conductive gate 322 is electrically connected to the floating gate 306, such that the conductive gate 322 leaks charges from the floating gate 306 in a predetermined leak time period. In some example implementations, a metal via 324 may be provided in the second dielectric layer 318 to couple the conductive gate 322 to the floating gate 306. The metal via 324 may be understood as a metal stud that may be placed between two layers of an integrated circuit to provide electrical connectivity.

Further, in one example implementation, the conductive gate 322 is provided in the metal layer 320 of the EPROM cell 300 that includes the control gate 316. The conductive gate 322 and the control gate 316 are formed in the common metal layer 320 such that the conductive gate 322 and the control gate 316 are electrically isolated from each other. It will be understood that, alike the control gate 316, the conductive gate 322, too, may be made of TaAl/AlCu or Ta/Au, and may have a thickness of about 4-5 KA.

Additionally, in some example implementations, the EPROM cell 300 comprises a barrier layer (not shown in figure) disposed atop the common metal layer 320. The barrier layer may be made of a polymer material, such as IJ5000 and SU8, in one example. In an example, the barrier layer may comprise one or more chambers to expose a surface of the conductive gate 322. Accordingly, in some example implementations of the EPROM cell 300, the conductive gate 322 may have an exposed surface that may not be covered by any layer, for example. The exposed surface of the conductive gate 322 dissipates the electrons from the floating gate 306.

In operation, a high voltage bias, i.e., a programming voltage $V_p$, applied across the drain junction and the control gate 316 generates energetic electrons, and a positive bias between the drain junction and the control gate 316 may pull some of the generated electrons into the floating gate 306. Depending on the configuration of the integrated circuit, in one example, the programming voltage $V_p$, may be in the range of 12-20V. As more and more electrons are pulled onto the floating gate 306, the voltage to cause the floating gate 306 to conduct current increases, and eventually the voltage may become more than, say, an operating voltage of the EPROM cell 300. This causes the floating gate 306 to block current and store the applied charge, i.e., free electrons.

The electrons may ordinarily remain trapped in the floating gate 306 until the EPROM cell 300 is further reprogrammed. However, in accordance with one example implementation of the present subject matter, the floating gate 306 is connected to the conductive gate 322, having the exposed surface, through the metal via 324. The conductive gate 322 leaks the electrons from the floating gate 306 in the predetermined leak time period through the exposed surface.

Since the exposed surface of the conductive gate 322 leaks the charges that may be stored in the floating gate 306, the predetermined leak time period is based on the surface area of the exposed surface. In an example, the predetermined leak time period is in the range of few microseconds to few tens of minutes and the surface area corresponding to the predetermined leak time period may be left exposed in the conductive gate 322.

The various layers depicted in the figure correspond to the EPROM cell 300 that is dischargeable, according to an example of the present subject matter. Other EPROM cells, that retain the charge after programming, may also be present in the integrated circuit. In an example, the EPROM cells that retain the charge can be implemented in a similar manner by excluding the conductive gate 322 that provides the electron leakage path from EPROM cells. To describe in context of the illustrated implementation, an EPROM cell that is not dischargeable may not include the metal via 324 and conductive gate 322.

Referring to the schematic view of the EPROM 300 shown in FIG. 3b, the control gate 316 is capacitively coupled to the floating gate 306 comprising the semiconductive polysilicon layer 308 and the conductive metal layer 310 that are electrically connected to each other. The programming voltage $V_p$ applied at the control gate 316, causes electrons to move into the floating gate 306. The metal via 324 connected to the conductive metal layer 310 of the floating gate 306 carries the electron away from the floating gate 306 to the conductive gate 322 from the where the electrons are leaked out, for example, into the atmosphere. Thus, although the EPROM cell 300 is programmed, it may not retain the charge alike other EPROM cells of the integrated circuit.

Accordingly in an example implementation, an integrated circuit may include one or more dischargeable EPROM cells at certain locations, while the same may be absent at other locations. The discharging of the one or more dischargeable EPROM cells may cause a change in date written onto the integrated circuit. In one example implementation, the change in the data may be determined based on the predetermined locations of such EPROM cells. Further, the change in data, in one example, may in turn provide for product identification as explained earlier.

Although implementations for integrated circuits and dischargeable EPROM cells have been described in language specific to structural features and/or methods, it would be understood that the appended claims are not necessarily limited to the specific features or methods described. Rather, the specific features and methods are disclosed as example implementations for integrated circuits.

We claim:

1. A dischargeable electrical programmable read only memory (EPROM) cell comprising:
    a semiconductor substrate;
    a floating gate separated from the semiconductor substrate by a first dielectric layer;
    a control gate capacitively coupled to the floating gate through a second dielectric layer disposed between the floating gate and the control gate; and
    a conductive gate over the semiconductor substrate and connected to the floating gate, the conductive gate including:
        an upper exposed surface that faces away from the underlying semiconductor substrate, and
        an electrical connection to cause charges to flow, from the floating gate and leak through the exposed surface and away from the underlying semiconductor substrate.

2. The dischargeable EPROM cell as claimed in claim 1, wherein the conductive gate is separate from a transistor including the control gate and the floating gate and is to leak the charges through the exposed surface over a time period determined by the surface area of the exposed surface.

3. The dischargeable EPROM cell as claimed in claim 2, wherein exposed surface is sized to set a predetermined leak time period over which the leakage through the exposed surface causes a change in logic state of the EPROM cell.

4. The dischargeable EPROM cell as claimed in claim 1, wherein the exposed surface of the conductive gate is offset from the semiconductor substrate, located at a top-most surface of the EPROM cell and connected to the floating gate through a metal via placed in the second dielectric layer.

5. The dischargeable EPROM cell as claimed in claim 1, wherein the floating gate comprises a semiconductive polysilicon layer and a conductive metal layer electrically connected to each other.

6. The dischargeable EPROM cell as claimed in claim 5, further comprising a via to connect the semiconductive polysilicon layer and the conductive metal layer.

7. The dischargeable EPROM cell as claimed in claim 1, wherein the control gate and the conductive gate are formed in a common metal layer electrically isolated from each other.

8. The dischargeable EPROM cell as claimed in claim 1, wherein:
    the floating gate is to set a logic state of the EPROM in response to a programming charge applied to the floating gate; and
    the floating gate and the conductive gate are to, in response to the logic state of the EPROM being set, change the logic state of the EPROM cell by leaking the programming charge from the floating gate through the exposed surface during a predetermined leak time period.

9. The dischargeable EPROM cell as claimed in claim 1, wherein the conductive gate is to cause the charges to leak from the floating gate and to flow and leak from the floating gate to the exposed surface at a predetermined rate.

10. The dischargeable EPROM cell as claimed in claim 1, further including an IC package portion exposed to surrounding atmosphere wherein energy leaked from the floating gate is dispersed via the exposed surface, wherein the electrical connection extends between the exposed surface and the floating gate.

11. The dischargeable EPROM cell as claimed in claim 1, wherein the exposed surface has a surface area set to cause a logic state of the floating gate to switch by leaking a sufficient amount of the charges through the surface area during a predetermined leak time period in the range of few microseconds to few tens of minutes.

12. An integrated circuit comprising:
    an electrical programmable read only memory (EPROM) array having a plurality of EPROM cells disposed in rows and columns, wherein an EPROM cell at a predetermined position in the EPROM array is dischargeable, the EPROM cell comprising:
        a floating gate on a semiconductor substrate, wherein the floating gate is to store electrons upon the EPROM cell being programmed; and
        a conductive gate over the floating gate and the semiconductor substrate, comprising an exposed upper surface facing away from the semiconductor substrate and electrically connected to the floating gate, wherein the conductive gate is to leak the electrons from the floating gate, through the exposed surface and away from the underlying semiconductor substrate, in a predetermined leak time period.

13. The integrated circuit as claimed in claim 12, wherein the EPROM cell comprises:
    a semiconductor substrate, having a source junction and a drain junction;
    the floating gate, separated from the semiconductor substrate by a first dielectric layer;
    a control gate, capacitively coupled to the floating gate through a second dielectric layer disposed between the floating gate and the control gate, such that a programming voltage applied to the control gate, to program the EPROM cell, is to cause the electrons from the semiconductor substrate to move into the floating gate; and
    a metal via, located in the second dielectric layer, to conduct the electrons from the floating gate to the conductive gate to leak the electrons via the exposed surface, the conductive gate being offset from the floating gate and over the second dielectric layer.

14. The integrated circuit as claimed in claim 13, wherein the control gate and the conductive gate are formed in a common metal layer electrically isolated from each other.

15. The integrated circuit as claimed in claim 14, comprising a barrier layer atop the common metal layer, wherein the barrier layer comprises one or more chambers to expose a surface of the conductive gate.

16. The integrated circuit as claimed in claim 12, wherein the floating gate comprises a semiconductive polysilicon layer and a conductive metal layer electrically connected to each other.

17. The integrated circuit as claimed in claim 16, wherein a via connects the semiconductive polysilicon layer and the conductive metal layer.

18. The integrated circuit as claimed in claim 12, wherein the predetermined leak time period is based on a surface area of an exposed surface of the conductive gate.

19. The integrated circuit as claimed in claim 12, wherein the predetermined leak time period is in the range of few microseconds to few tens of minutes.

20. The integrated circuit as claimed in claim 12, wherein the EPROM cell at the predetermined position is to
- store a logic value in response to a programming charge being applied to the floating gate; and
- in response to the logic value being stored, cause the stored logic value to change by leaking the programming charge through the conductive gate over the duration of the predetermined leak time period.

* * * * *